(12) United States Patent
Mei et al.

(10) Patent No.: US 12,150,382 B2
(45) Date of Patent: Nov. 19, 2024

(54) THERMOELECTRIC GENERATION MODULE

(71) Applicant: Sanoh Industrial Co., Ltd., Tokyo (JP)

(72) Inventors: Biao Mei, Koga (JP); Naoya Goto, Koga (JP); Masaki Takeuchi, Koga (JP)

(73) Assignee: Sanoh Industrial Co., Ltd., Tokyo (JP)

( * ) Notice: Subject to any disclaimer, the term of this patent is extended or adjusted under 35 U.S.C. 154(b) by 0 days.

(21) Appl. No.: 17/621,015

(22) PCT Filed: Jun. 17, 2020

(86) PCT No.: PCT/JP2020/023797
§ 371 (c)(1),
(2) Date: Dec. 20, 2021

(87) PCT Pub. No.: WO2020/262165
PCT Pub. Date: Dec. 30, 2020

(65) Prior Publication Data
US 2022/0367779 A1    Nov. 17, 2022

(30) Foreign Application Priority Data
Jun. 26, 2019 (JP) .................. 2019-119041

(51) Int. Cl.
*H10N 10/17* (2023.01)
(52) U.S. Cl.
CPC .................. *H10N 10/17* (2023.02)
(58) Field of Classification Search
None
See application file for complete search history.

(56) References Cited

U.S. PATENT DOCUMENTS

| 2010/0258155 A1 | 10/2010 | Lee et al. | |
| 2015/0072231 A1* | 3/2015 | Kudoh | H01M 10/0525 |
| | | | 429/209 |

FOREIGN PATENT DOCUMENTS

| JP | 2002-042863 A | 2/2002 |
| JP | 2005-251417 A | 9/2005 |
| JP | 2009-009722 A | 1/2009 |
| JP | 2010-251692 A | 11/2010 |
| JP | 2018-019042 A | 2/2018 |
| WO | 2012/140856 A1 | 10/2012 |
| WO | 2013/161926 A1 | 10/2013 |

(Continued)

OTHER PUBLICATIONS

Patent Cooperation Treaty, International Preliminary Report on Patentability, Application No. PCT/JP2020/023797, dated Jan. 6, 2022, in 5 pages.

(Continued)

*Primary Examiner* — Dustin Q Dam
(74) *Attorney, Agent, or Firm* — PROCOPIO, CORY, HARGREAVES & SAVITCH LLP

(57) ABSTRACT

The thermoelectric module includes a first thermoelectric element including a first thermoelectric conversion layer and a first electrolyte layer stacked in order along a stacked direction, a second thermoelectric element including a second electrolyte layer and a second thermoelectric conversion layer stacked in order along the stacked direction, and a first current collector located between the first thermoelectric element and the second thermoelectric element in the stacked direction.

11 Claims, 8 Drawing Sheets

(56) References Cited

FOREIGN PATENT DOCUMENTS

| WO | 2015/087388 A1 | 6/2015 | |
|---|---|---|---|
| WO | 2017/038988 A1 | 3/2017 | |
| WO | WO-2019007812 A1 * | 1/2019 | ........ H01M 10/0459 |

OTHER PUBLICATIONS

Junji Inukai, "Surface Science for Secondary Batteries and Capacitors", Purpose of Special Feature, Surface Science vol. 34, No. 6, pp. 286-289, 2013.

* cited by examiner (a)

(b)

(a)

(b)

(c)

(a)

(b)

(c)

THERMOELECTRIC GENERATION MODULE

CROSS-REFERENCE TO RELATED APPLICATIONS

This application is US National Stage of International Patent Application PCT/JP2020/023797, filed Jun. 17, 2020, which claims benefit of priority from Japanese Patent Application JP2019-119041, filed Jun. 26, 2019, the contents of both of which are incorporated herein by reference.

TECHNICAL FIELD

The present disclosure relates to a thermoelectric module.

BACKGROUND ART

As a heat-utilizing power generation using geothermal heat, exhaust heat of a factory, or the like, a method using the Seebeck effect can be included. In addition, as a heat-utilizing power generation that does not use the Seebeck effect, a heat-utilizing power generating element disclosed in Patent Literature 1 below can be included. Patent Literature 1 below discloses that thermal energy is converted into electrical energy by combining an electrolyte and a thermoelectric conversion material that generates a thermal excitation electron and a hole. By using such a heat-utilizing power generating element as a power source for an electronic component, stable power can be supplied to the electronic component, for example, even under a high-temperature environment (for example, 50° C. or more) where a general cell easily deteriorates.

CITATION LIST

Patent Literature

[Patent Literature 1] International Publication No. WO 2017/038988

SUMMARY OF INVENTION

Technical Problem

In order to put the above-described power generation apparatus using heat into practical use, it is required to increase the output current in a limited space depending on the application.

An object of an aspect of the present disclosure is to provide a thermoelectric module capable of increasing an output current in a limited space according to an application.

Solution to Problem

A thermoelectric module according to an aspect of the present disclosure includes a first thermoelectric element including a first thermoelectric conversion layer and a first electrolyte layer stacked in order along a stacked direction, a second thermoelectric element including a second electrolyte layer and a second thermoelectric conversion layer stacked in order along the stacked direction, and a first current collector located between the first thermoelectric element and the second thermoelectric element in the stacked direction.

The thermoelectric module includes a first thermoelectric element and a second thermoelectric element stacked each other along a stacked direction. As a result, the thermoelectric elements can be efficiently arranged in a limited space according to the application. In addition, the thermoelectric module includes a first current collector located between the first thermoelectric element and the second thermoelectric element in the stacked direction, the first electrolyte layer and the second electrolyte layer face each other via the first current collector, and the first thermoelectric element and the second thermoelectric element are connected in parallel to each other. Therefore, when the thermoelectric module is heated, current is output from both the first thermoelectric element and the second thermoelectric element, so that the output current of the thermoelectric module can be increased.

The first current collector may include a first surface located on a side of the first thermoelectric element in the stacked direction and in contact with the first electrolyte layer and a second surface located on a side of the second thermoelectric element in the stacked direction and in contact with the second electrolyte layer, and the first electrolyte layer and the second electrolyte layer may be integrated with each other at an edge of the first current collector. In this case, for example, the first electrolyte layer and the second electrolyte layer can be simultaneously formed for the first current collector. Thus, the manufacturing cost of the thermoelectric module can be reduced.

The thermoelectric module may further include a second current collector including a third surface in contact with the first thermoelectric conversion layer and a fourth surface in contact with the second thermoelectric conversion layer, wherein the first current collector, the first thermoelectric element, the second thermoelectric element, and the second current collector extend along a longitudinal direction intersecting the stacked direction and are wound. In this case, the thermoelectric elements can be arranged more efficiently in a limited space according to the application.

The first thermoelectric conversion layer and the second thermoelectric conversion layer may be integrated with each other at the edge of the second current collector. In this case, for example, the first thermoelectric conversion layer and the second thermoelectric conversion layer can be simultaneously formed for the second current collector. Thus, the manufacturing cost of the thermoelectric module can be reduced.

Each of the first electrolyte layer and the second electrolyte layer may be intermittently provided along the longitudinal direction of the first current collector, and each of the first thermoelectric conversion layer and the second thermoelectric conversion layer may be intermittently provided along the longitudinal direction of the second current collector. In this case, when the first current collector and the second current collector are wound, damage to the first thermoelectric element and the second thermoelectric element may be suppressed.

The first thermoelectric conversion layer may include an electron thermal excitation layer and an electron transport layer stacked with each other in a stacked direction, and the electron thermal excitation layer may be located between the electron transport layer and the first electrolyte layer. In this case, since electrons are satisfactorily extracted from the electron thermal excitation layer via the electron transport layer, the performance of the thermoelectric module can be improved.

Advantageous Effects of Invention

According to an aspect of the present disclosure, it is possible to provide a thermoelectric module capable of increasing an output current in a limited space according to an application.

Figure 2:
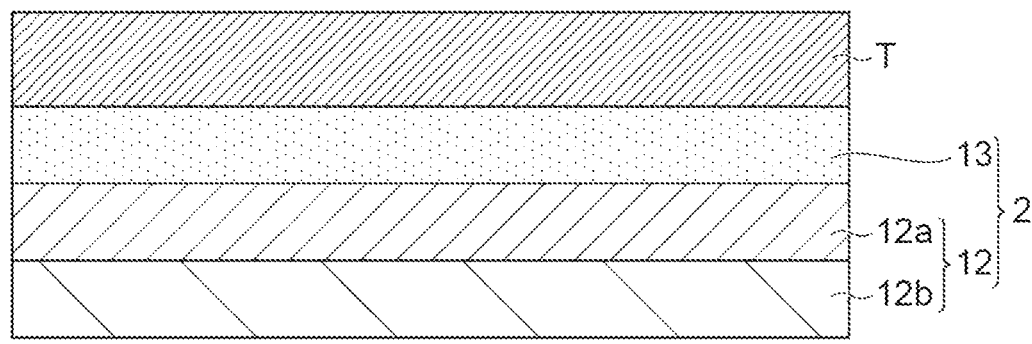
Figure 2:
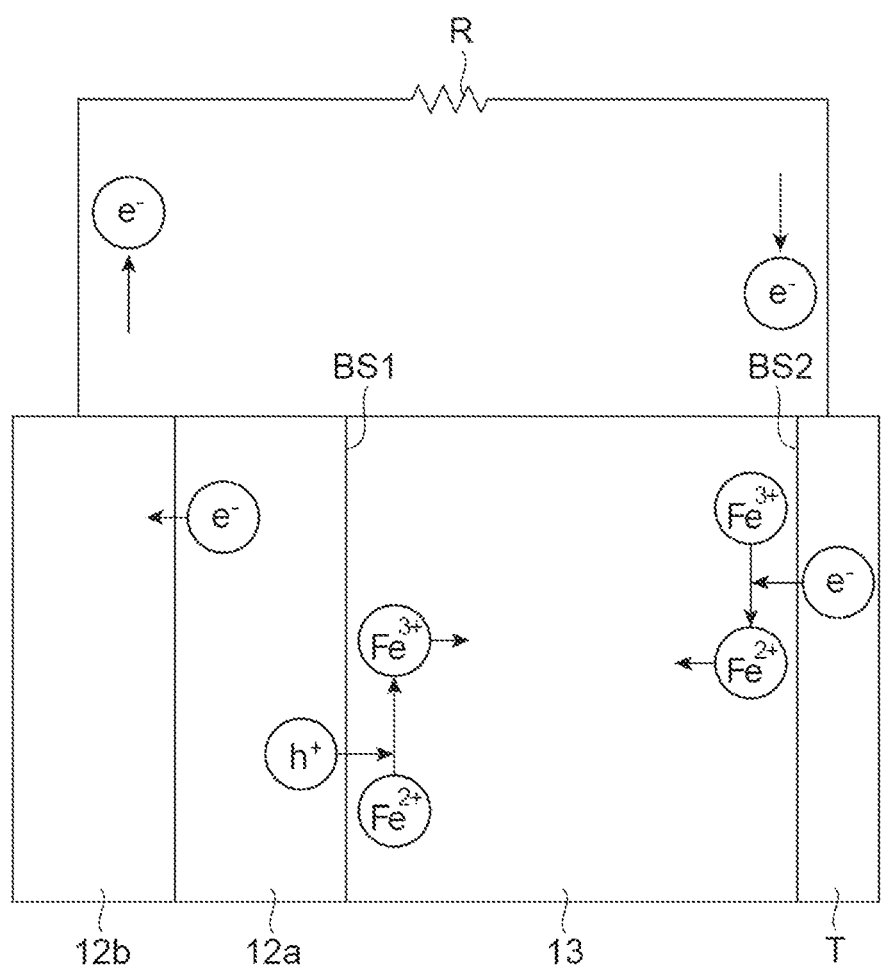

(a) of FIG. 2 is a schematic cross-sectional view showing a single thermoelectric element and a terminal, and (b) of FIG. 2 is a schematic view for explaining a power generation mechanism of the thermoelectric element.

Figure 3:
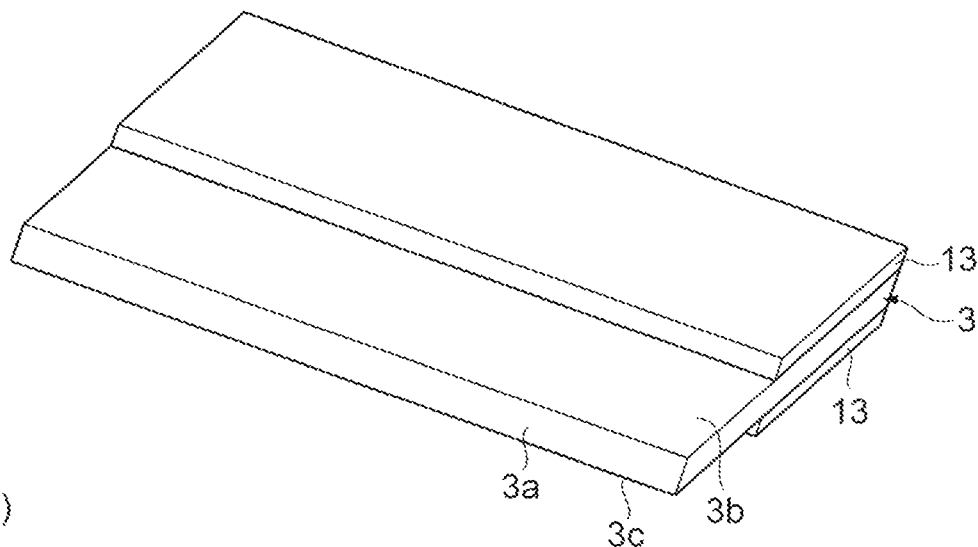
Figure 3:
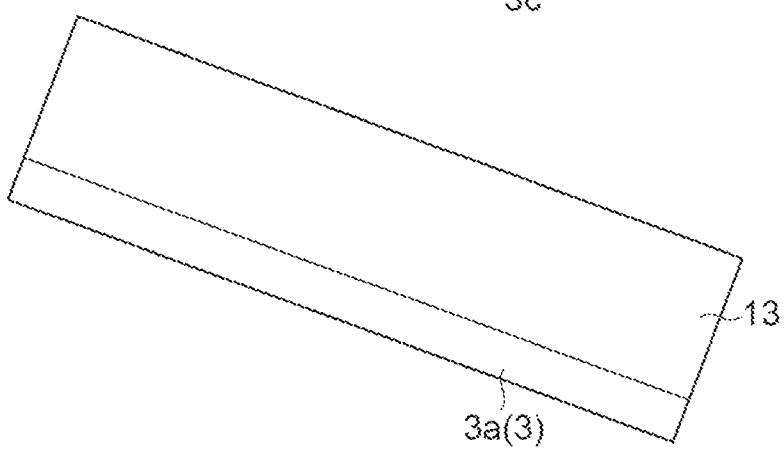
Figure 3:
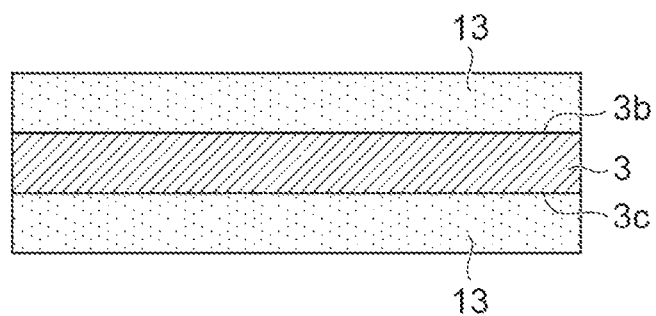

(a) of FIG. 3 is a schematic perspective view of a first current collector, (b) of FIG. 3 is a plan view of (a) of FIG. 3, and (c) of FIG. 3 is a partial cross-sectional view of (a) of FIG. 3.

Figure 4:
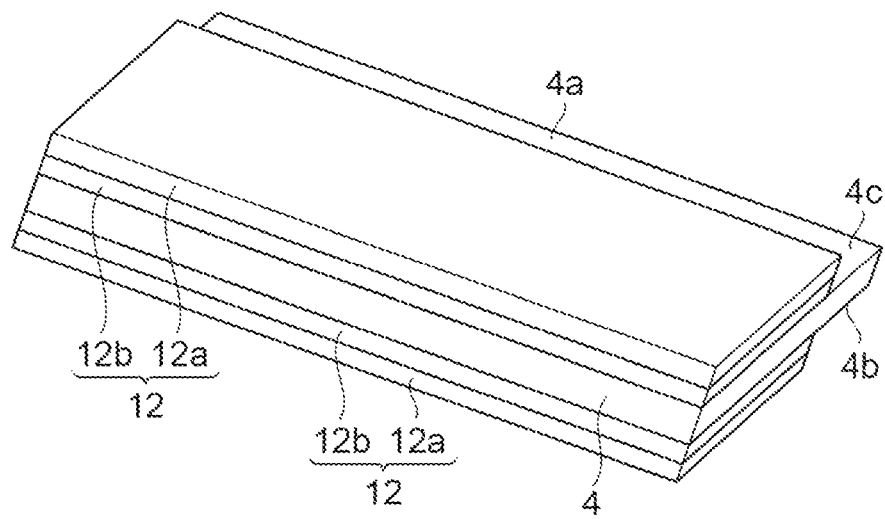
Figure 4:
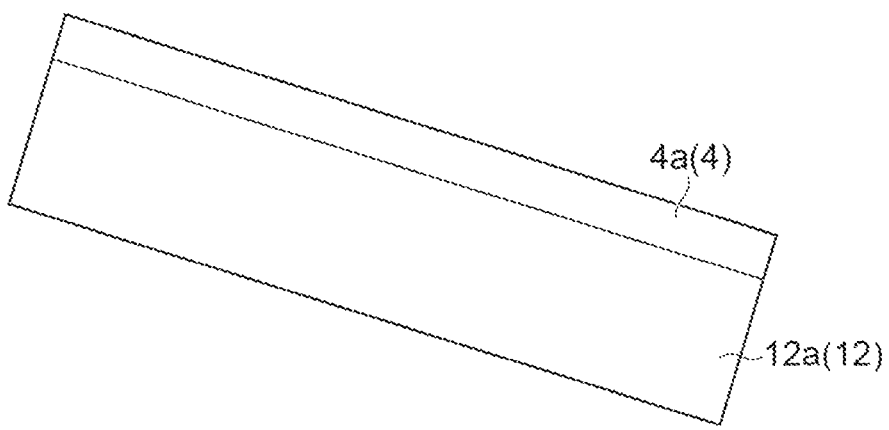
Figure 4:
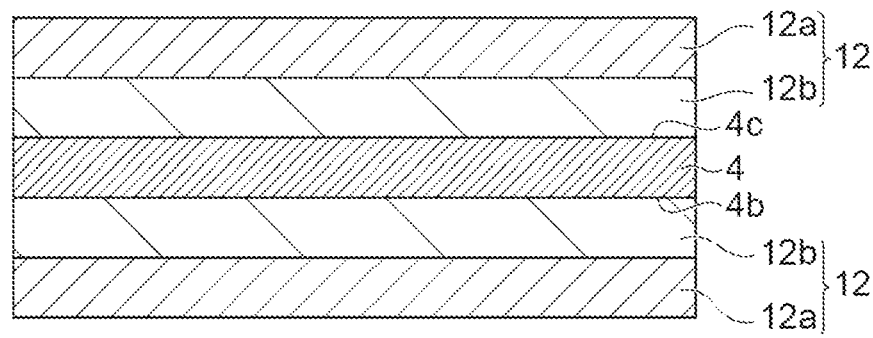

(a) of FIG. 4 is a schematic perspective view of a second current collector, (b) of FIG. 4 is a plan view of (a) of FIG. 4, and (c) of FIG. 4 is a partial cross-sectional view of (a) of FIG. 4.

Figure 5:
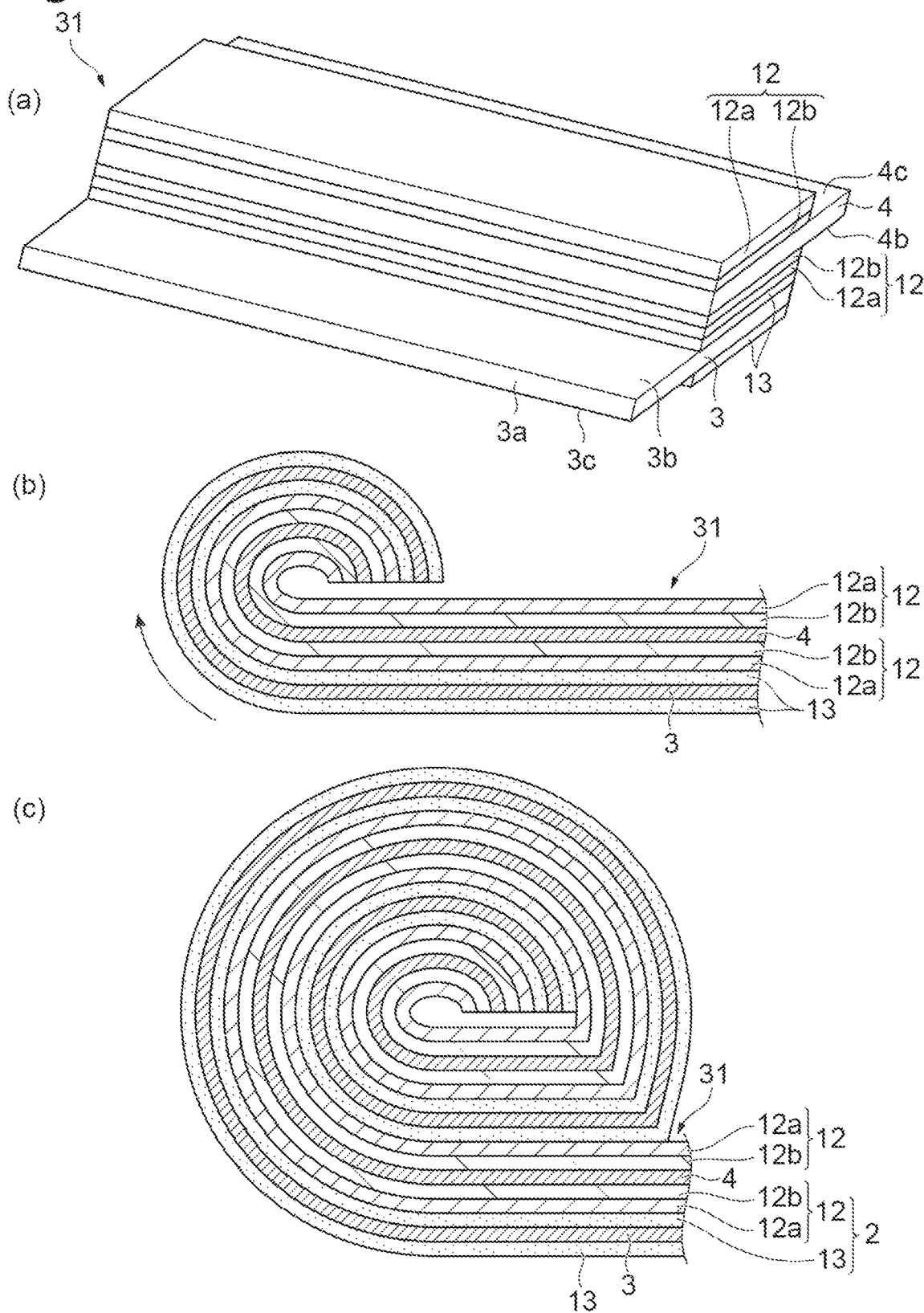

(a) to (c) of FIG. 5 are diagrams for explaining a method of manufacturing a thermoelectric module.

Figure 6:
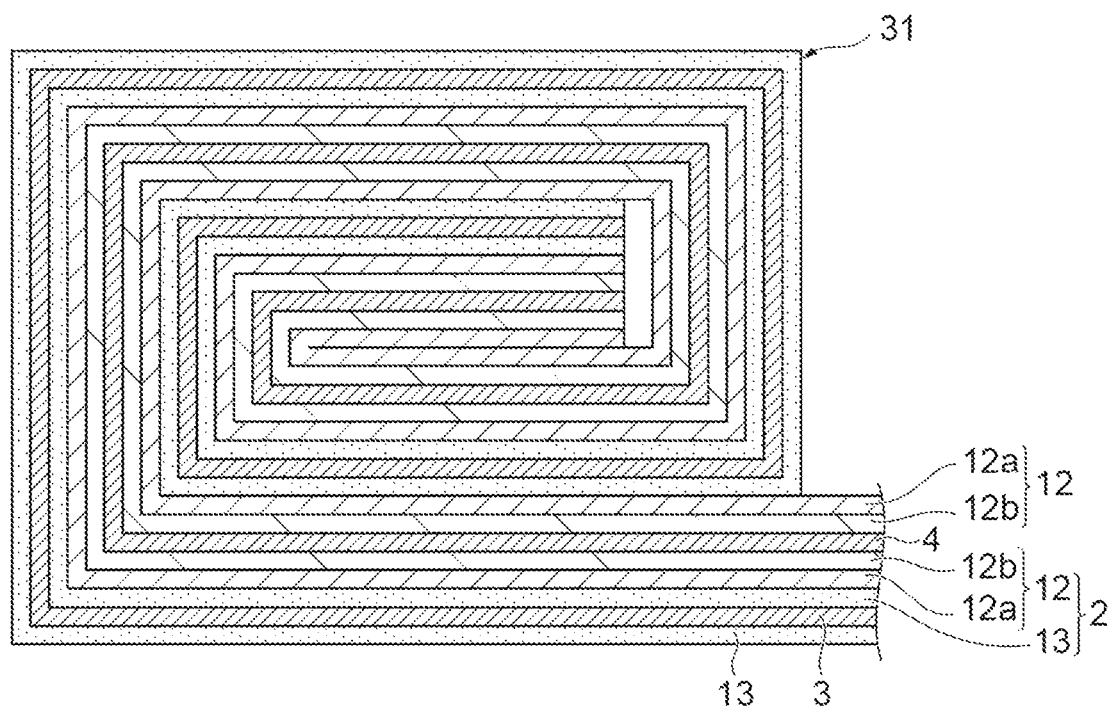

FIG. 6 is a schematic cross-sectional view showing a part of a thermoelectric module according to a first modification of the first embodiment.

Figure 7:
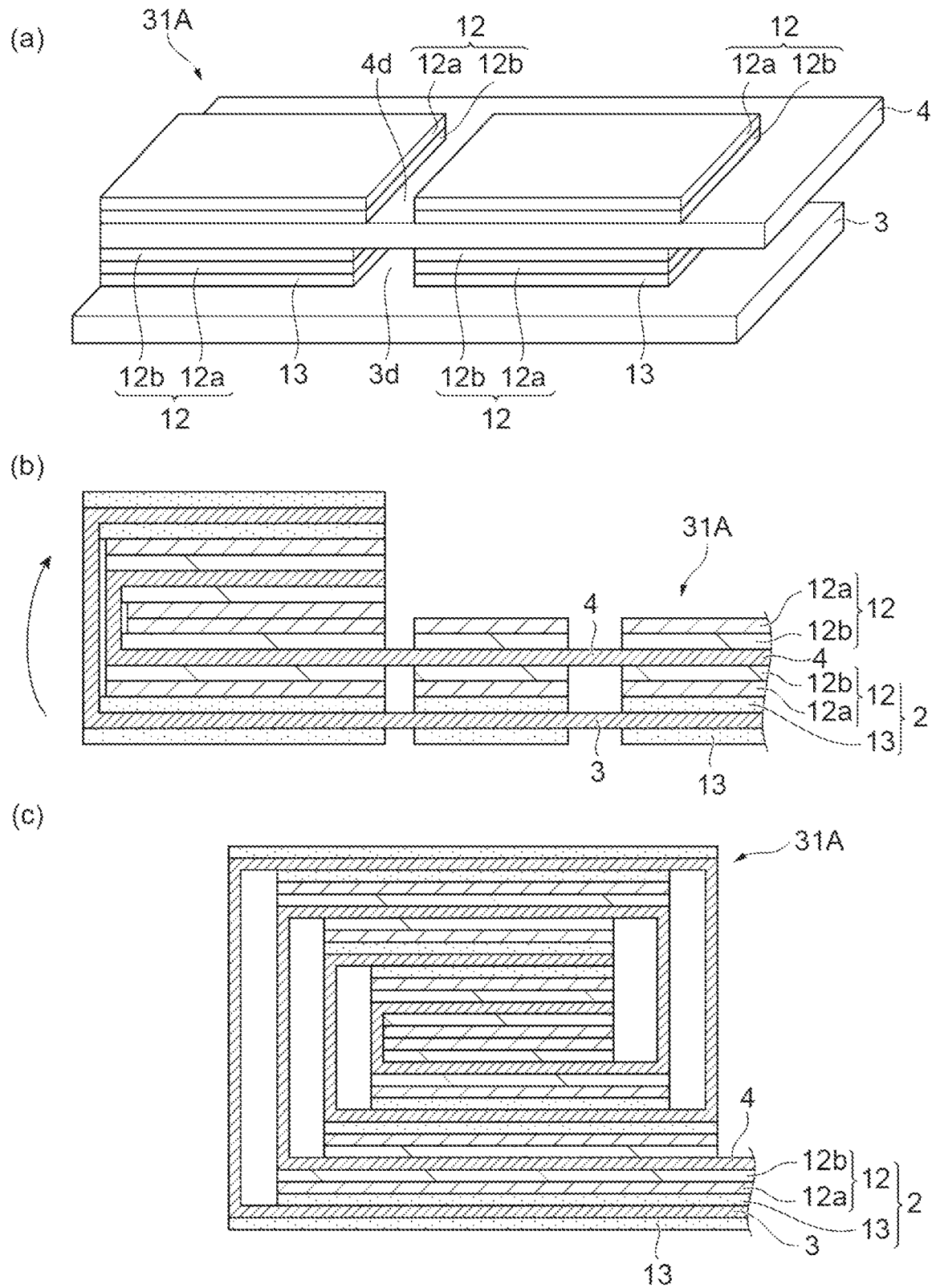

(a) of FIG. 7 is a perspective view showing a state before stack is wound, and (b) and (c) of FIG. 7 are views showing a state in which stack is wound.

Figure 8:
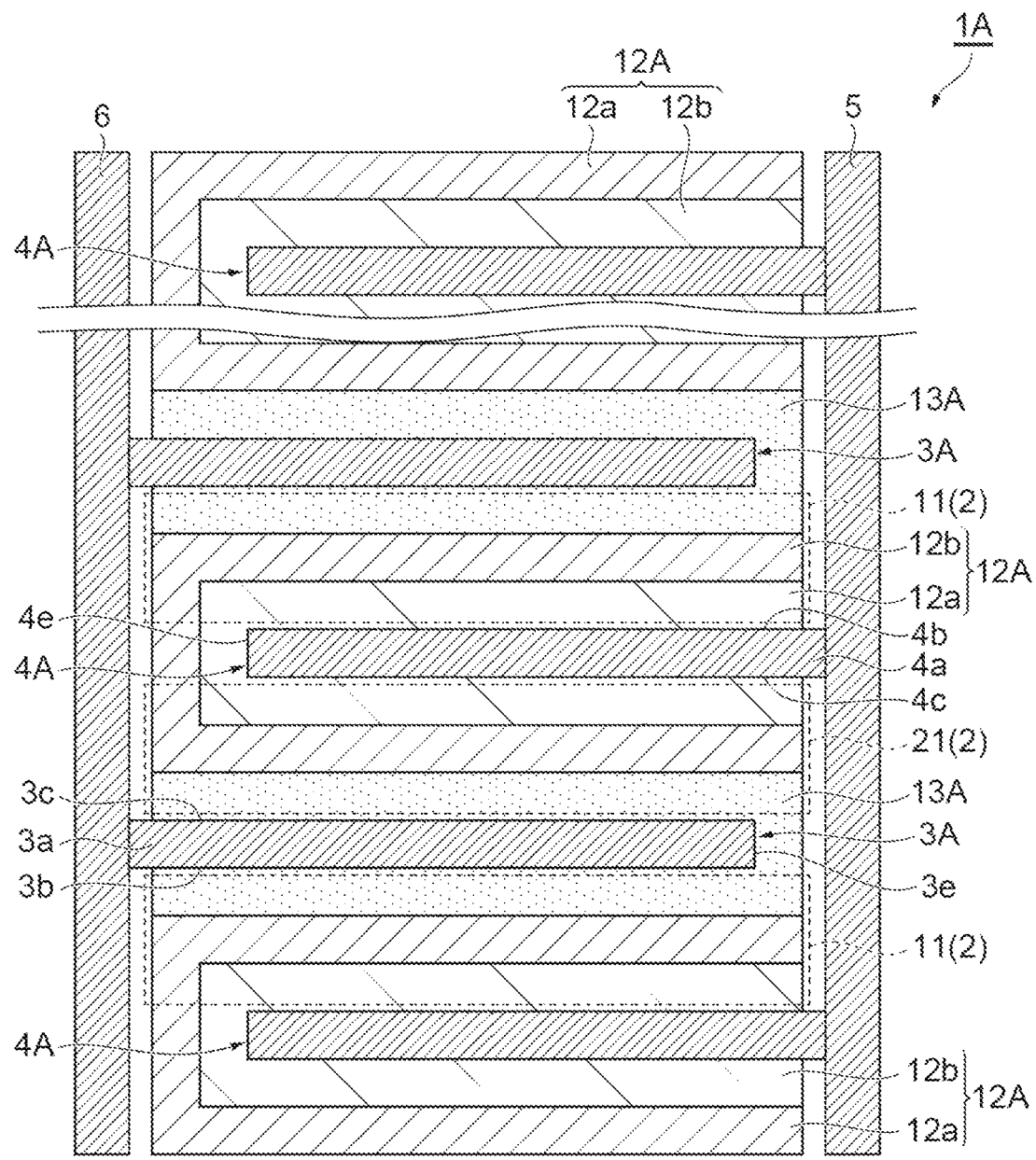

FIG. 8 is a schematic cross-sectional view illustrating a thermoelectric module according to a second embodiment.

DESCRIPTION OF EMBODIMENTS

Hereinafter, embodiments of the present disclosure will be described in detail with reference to the accompanying drawings. In the following explanation, the same reference numerals will be used for the same elements or elements having the same function, and duplicate explanation will be omitted.

First Embodiment

Figure 1:
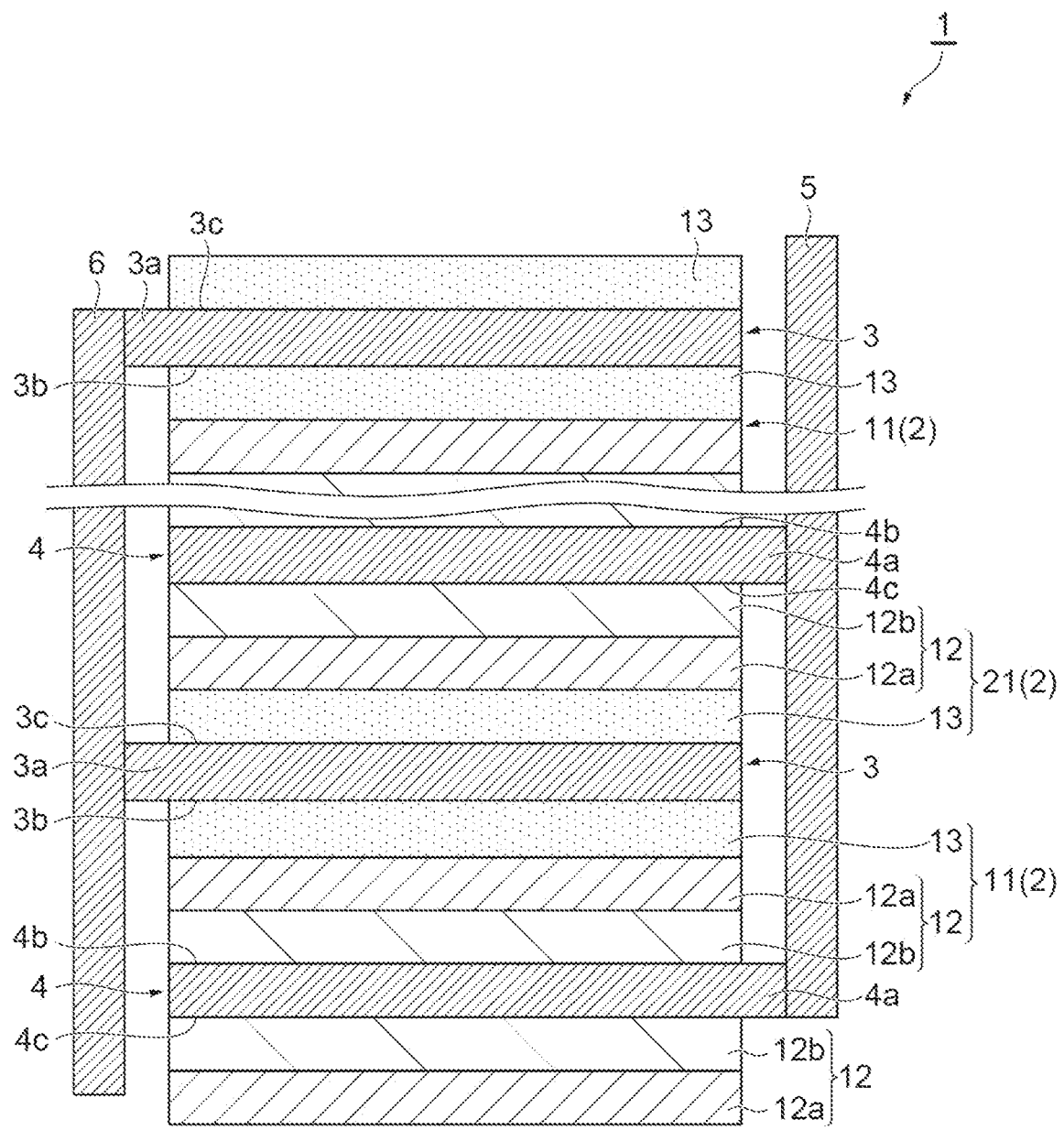
FIG. 1 is a schematic cross-sectional view illustrating a thermoelectric module according to a first embodiment.

The configuration of the thermoelectric module according to the first embodiment will be described with reference to FIG. 1. FIG. 1 is a schematic cross-sectional view illustrating a thermoelectric module according to a first embodiment. The thermoelectric module 1 shown in FIG. 1 is an aggregate of members (i.e., thermoelectric generators for converting thermal energy into electrical energy) that exhibit a function of generating power by being supplied with heat from the outside. The thermoelectric module 1 includes a plurality of thermoelectric elements 2, a plurality of first current collectors 3, a plurality of second current collectors 4, and an outer electrode 5, 6. The shape of the thermoelectric module 1 is not particularly limited. The shape of the thermoelectric module 1 in a plan view may be, for example, a polygonal shape such as a rectangular shape, a circular shape, or an elliptical shape.

The plurality of thermoelectric elements 2, the first current collector 3, and the second current collector 4 are stacked each other along a predetermined direction. Hereinafter, the predetermined direction is simply referred to as a "stacked direction." In the present specification, "identical" is a concept including not only "completely identical" but also "substantially identical."

Each of the thermoelectric elements 2 is a thermoelectric generator having the same shape, and generates thermally excited electrons and holes by being supplied with heat from the outside. The generation of thermally excited electrons and holes by the thermoelectric element 2 is performed at, for example, 25° C. or higher and 300° C. or lower. From the viewpoint of generating a sufficient number of thermally excited electrons and holes, the thermoelectric element 2 may be heated to, for example, 50° C. or higher during use of the thermoelectric module 1. From the viewpoint of satisfactorily preventing deterioration or the like of the thermoelectric element 2, the thermoelectric element 2 may be heated to, for example, 200° C. or lower during use of the thermoelectric module 1. The temperature at which a sufficient number of thermally excited electrons are generated is, for example, "a temperature at which the thermally excited electron density of the thermoelectric element 2 is $10^{15}/cm^3$ or more."

In the first embodiment, the of thermoelectric elements 2 are stacked each other along the stacked direction and are connected in parallel to each other. The number of the thermoelectric elements 2 varies depending on the performance required for the thermoelectric module 1.

Each of the thermoelectric elements 2 is a stack including a thermoelectric conversion layer 12 and an electrolyte layer 13 stacked each other in the stacked direction. The thermoelectric conversion layer 12 is a flexible layer including an electron thermal excitation layer 12a and an electron transport layer 12b stacked each other in the stacked direction.

The electron thermal excitation layer 12a is a layer for generating thermally excited electrons and holes in the thermoelectric element 2, and is in contact with the electrolyte layer 13. The electron thermal excitation layer 12a includes a thermoelectric conversion material. The thermoelectric conversion material is a material in which excited electrons increase under a high-temperature environment, and is, for example, a semiconductor material such as a metal semiconductor (Si, Ge), a tellurium compound semiconductor, a silicon germanium (Si—Ge) compound semiconductor, a silicide compound semiconductor, a skutterudite compound semiconductor, a clathrate compound semiconductor, a Heusler compound semiconductor, a half-Heusler compound semiconductor, a metal oxide semiconductor, or an organic semiconductor. From the viewpoint of generating sufficient thermally excited electrons at a relatively low temperature, the thermoelectric conversion material may be germanium (Ge). The electron thermal excitation layer 12a has a thickness of, for example, 0.1 μm or more and 100 μm or less. In this case, the electron thermal excitation layer 12a exhibits good flexibility.

The electron thermal excitation layer 12a may include several thermoelectric conversion materials. The electron thermal excitation layer 12a may include a material other than the thermoelectric conversion material. For example, the electron thermal excitation layer 12a may include a binder for binding the thermoelectric conversion material, a sintering aid for assisting in forming the thermoelectric conversion material, and the like. The electron thermal excitation layer 12a is formed by, for example, a squeegee method, a screen printing method, a discharge plasma sintering method, a compression molding method, a sputtering method, a vacuum deposition method, a chemical vapor deposition method (CVD method), a spin coating method, or the like.

The electron transport layer 12b is a layer for transporting the thermally excited electrons generated in the electron thermal excitation layer 12a to the outside, and is located on the opposite side of the electrolyte layer 13 via the electron thermal excitation layer 12a in the stacked direction. Therefore, in the thermoelectric element 2, the electron thermal excitation layer 12a is located between the electron transport layer 12b and the electrolyte layer 13 in the stacked direction. The electron transport layer 12b includes an electron transport material. The electron transport material is a material whose conduction band potential is equal to or more positive than that of the thermoelectric conversion material. The difference between the conduction band potential of the electron transport material and the conduction band potential of the thermoelectric conversion material is, for example, 0.01V or more and 0.1V or less. Examples of the electron transport material include a semiconductor material, a metal material, and an electron transporting organic substance. The electron transport layer 12b is formed by, for example, a squeegee method, a screen printing method, a discharge plasma sintering method, a compression molding method, a sputtering method, a vacuum deposition method, a CVD method, a spin coating method, or the like. The thickness of the electron transport layer 12b is, for example, 0.1 µm or more and 100 µm or less. In this case, the electron transport layer 12b exhibits good flexibility.

The semiconductor material used for the electron transport material is, for example, the same as the semiconductor material included in the electron thermal excitation layer 12a. Examples of the metal material include metals, alloys, N-type metal oxides, N-type metal sulfides, alkali metal halides, and alkali metals. N-type metals are, for example, niobium, titanium, zinc, tin, vanadium, indium, tungsten, tantalum, zirconium, molybdenum and manganese. Examples of the electron transporting organic substance include an N-type conductive polymer, an N-type low molecular weight organic semiconductor, and a π-electron conjugated compound. The electron transport layer 12b may include several electron transport materials. The electron transport layer 12b may include a material other than the electron transport material. For example, the electron transport layer 12b may include a binder for binding the electron transport material, a sintering aid for assisting in forming the electron transport material, and the like. From the viewpoint of electron transportability, the semiconductor material may be n-type Si. The electron transport layer 12b including n-type Si is formed, for example, by doping a silicon layer with phosphorus or the like.

The electrolyte layer 13 is a layer including an electrolyte in which a charge transport ion pair can move at a temperature at which a sufficient number of thermally excited electrons are generated in the thermoelectric element 2, and exhibits flexibility. The charge transport ion pair moves in the electrolyte layer 13, whereby a current flows in the electrolyte layer 13. The "charge transport ion pair" is a stable pair of ions with different valences. When one ion is oxidized or reduced, it becomes the other ion and can move electrons and holes. The redox potential of the charge transport ion pair in the electrolyte layer 13 is more negative than the valence band potential of the thermoelectric conversion material included in the electron thermal excitation layer 12a. Therefore, at the interface between the electron thermal excitation layer 12a and the electrolyte layer 13, the easily oxidizable ion of the charge transport ion pair is oxidized to become the other ion. The electrolyte layer 13 may include ions other than charge transport ion pairs. The thickness of the electrolyte layer 13 is, for example, 0.1 µm or more and 100 µm or less. In this case, the electrolyte layer 13 exhibits good flexibility.

The electrolyte included in the electrolyte layer 13 is not particularly limited. The electrolyte may be, for example, a liquid electrolyte, a solid electrolyte, or a gel electrolyte. In first embodiments, the electrolyte layer 13 includes a solid electrolyte. The solid electrolyte is, for example, a substance that is physically and chemically stable at the above-described temperature, and may include polyvalent ions. Examples of the solid electrolyte include a sodium ion conductor, a copper ion conductor, an iron ion conductor, a lithium ion conductor, a silver ion conductor, a hydrogen ion conductor, a strontium ion conductor, an aluminum ion conductor, a fluorine ion conductor, a chlorine ion conductor, and an oxide ion conductor. The solid electrolyte may be, for example, polyethylene glycol (PEG) having a molecular weight of 600,000 or less or a derivative thereof. When the solid electrolyte is PEG, a polyvalent ion source such as copper ions or iron ions may be included in the electrolyte layer 13. Alkali metal ions may be included in the electrolyte layer 13 from the viewpoint of life improvement and the like. The molecular weight of PEG corresponds to the weight average molecular weight measured by gel permeation chromatography in terms of polystyrene.

The electrolyte layer 13 may be an organic electrolyte layer or an inorganic electrolyte layer. The organic electrolyte layer is, for example, an electrolyte layer mainly composed of one or more organic substances. The organic substance includes at least one of a low molecular weight organic compound and a high molecular weight organic compound. The inorganic electrolyte layer is, for example, an electrolyte layer mainly composed of one or more inorganic substances. The inorganic substance may be a simple substance or an inorganic compound. The organic electrolyte layer may include an inorganic material, and the inorganic electrolyte layer may include an organic material. Each of the organic material and the inorganic material may be an electrolyte or may be different from the electrolyte. For example, the electrolyte layer 13 may include an organic material or an inorganic material that functions as a binder for binding the electrolyte, a sintering aid for assisting in forming the electrolyte, and the like. The electrolyte layer 13 may be a hole transport semiconductor.

Here, referring to FIG. 2, the outline of the power generation mechanism of the thermoelectric element will be described. (a) of FIG. 2 is a schematic cross-sectional view showing a single thermoelectric element and a terminal, and (b) of FIG. 2 is a schematic view for explaining a power generation mechanism of the thermoelectric element. For the sake of explanation, the charge transport ion pair included in the electrolyte layer 13 shown in (a) and (b) of FIG. 2 is referred to as iron ion ($Fe^{2+}$ and $Fe^{3+}$). First, when the electron thermal excitation layer 12a absorbs heat in a high-temperature environment, an electron $e^-$ excited in the electron thermal excitation layer 12a is generated. The electron $e^-$ move to the electron transport layer 12b. As a result, a hole $h^+$ is generated in the electron thermal excitation layer 12a. The hole $h^+$ oxidize $Fe^{2+}$ at the first interface BS1 between the electron thermal excitation layer 12a and the electrolyte layer 13. That is, the hole $h^+$ robs the $Fe^{2+}$ electron at the first interface BS1. As a result, $Fe^{2+}$ located at the first interface BS1 becomes $Fe^{3+}$. On the other hand, the excess electrons $e^-$ in the electron transport layer 12b move to the outside, pass through a resistor R and a terminal T, and reach the electrolyte layer 13. The electron $e^-$ that has reached the electrolyte layer 13 reduces $Fe^{2+}$ at a second interface BS2 between the electrolyte layer 13 and the terminal T. As a result, $Fe^{2+}$ located at the second interface BS2 becomes $Fe^{2+}$. Then, $Fe^{2+}$ oxidized at the first interface BS1 is diffused toward the second interface BS2, and $Fe^{2+}$ reduced at the second interface BS2 is diffused toward the first interface BS1. Thus, the oxidation-reduction reaction between the first interface BS1 and the second interface BS2 is maintained. The thermoelectric element 2 generates power by generating electrons due to such thermal excitation and generating the oxidation-reduction reaction. The work that occurs when electrons pass through the resistor R corresponds to power generation.

Returning to FIG. 1, in the first embodiment, the thermoelectric element 2 includes a first thermoelectric module 11 in which the thermoelectric conversion layer 12 and the electrolyte layer 13 are stacked in order along the stacked direction, and a second thermoelectric element 21 in which the electrolyte layer 13 and the thermoelectric conversion layer 12 are stacked in order along the stacked direction. That is, the stacking order of the electron thermal excitation layer 12a, the electron transport layer 12b, and the electrolyte layer 13 in the first thermoelectric module 11 is different from the stacking order of the electron thermal excitation layer 12a, the electron transport layer 12b, and the electrolyte layer 13 in the second thermoelectric element 12. In addition, in the stacked direction, the first thermoelectric module 11 and the second thermoelectric element 21 are alternately stacked. Therefore, as shown in FIG. 1, the first current collector 3, the first thermoelectric module 11, the second current collector 4, and the second thermoelectric element 21 are stacked in order and in the stacked direction.

The first current collector 3 is an electrode that functions as one of a positive electrode and a negative electrode in the thermoelectric element 2. The second current collector 4 is an electrode that functions as the other of the positive electrode and the negative electrode in the thermoelectric element 2. Each of the first current collector 3 and the second current collector 4 is a conductive plate having, for example, a single-layer structure or a laminated structure. The conductive plate is, for example, a metal plate, an alloy plate, or a composite plate thereof, and exhibits flexibility. The thickness of each of the first current collector 3 and the second current collector 4 is, for example, 0.1 μm or more and 100 μm or less. In this case, the first current collector 3 and the second current collector 4 exhibit good flexibility. The first current collector 3 and the second current collector 4 respectively have protrusions 3a and 4a protruding from the thermoelectric element 2 along a direction intersecting the stacked direction (hereinafter, simply referred to as a "horizontal direction"). From the viewpoint of preventing contact of the outer electrodes 5, 6 and, it is desirable that the protruding portions 3a and 4a protrude in opposite directions. The edge of the first current collector 3 located on the opposite side of the protrusion 3a in the horizontal direction may be aligned with the edge of the thermoelectric conversion layer 12 or may be aligned with the edge of the electrolyte layer 13. Similarly, the edge of the second current collector 4 located on the opposite side of the protrusion 4a in the horizontal direction may be aligned with the edge of the thermoelectric conversion layer 12 or may be aligned with the edge of the electrolyte layer 13.

The first current collector 3 has horizontally extending surfaces 3b and 3c. The surface 3b (first surface) is located on a side of the first thermoelectric module 11 in the stacked direction and is in contact with the electrolyte layer 13 included in the first thermoelectric module 11. The surface 3c (second surface) is located on a side of the second thermoelectric element 21 in the stacked direction and is in contact with the electrolyte layer 13 included in the second thermoelectric element 21. Therefore, the electrolyte layer 13 included in the first thermoelectric module 11 and the electrolyte layer 13 included in the second thermoelectric element 21 face each other via the first current collector 3. On the other hand, the second current collector 4 has surfaces 4b and 4c extending in the horizontal direction. The surface 4b (third surface) is located on a side of the first thermoelectric module 11 in the stacked direction and is in contact with the thermoelectric conversion layer 12 included in the first thermoelectric module 11. The surface 4c (fourth surface) is located on a side of the second thermoelectric element 21 in the stacked direction and is in contact with the thermoelectric conversion layer 12 included in the second thermoelectric element 21. Therefore, the thermoelectric conversion layer 12 included in the first thermoelectric module 11 and the thermoelectric conversion layer 12 included in the second thermoelectric element 21 face each other via the second current collector 4.

At least one of the first current collector 3 and the second current collector 4 may exhibit high thermal conductivity from the viewpoint of favorably exhibiting the performance of the thermoelectric module 1. For example, the thermal conductivity of at least one of the first current collector 3 and the second current collector 4 may be 10 W/m·K or more. Since no temperature difference is required in the thermoelectric module 1, it is desirable that both the first current collector 3 and the second current collector 4 exhibit high thermal conductivity.

The outer electrode 5 is a conductor that functions as one of a positive electrode and a negative electrode of the thermoelectric module 1, and is electrically connected to each first current collector 3. The outer electrode 6 is a conductor that functions as the other of the positive electrode and the negative electrode of the thermoelectric module 1, and is electrically connected to each second current collector 4. Therefore, in the thermoelectric module 1, the thermoelectric elements 2 are connected in parallel to each other. At least one of the outer electrodes 5, 6 may exhibit high thermal conductivity from the viewpoint of favorably exhibiting the performance of the thermoelectric module 1. For example, the thermal conductivity of at least one of the outer electrodes 5, 6 may be 10 W/m·K or more. Since the outer electrode 5, 6 is spaced apart from the thermoelectric element 2, the outer electrode 5, 6 may include copper or the like. Since no temperature difference is required in the thermoelectric module 1, it is desirable that both of the outer electrodes 5, 6 exhibit high thermal conductivity.

Next, an example of a process for producing the thermoelectric module 1 according to the first embodiment will be described with reference to FIGS. 3 to 5. (a) of FIG. 3 is a schematic perspective view of a first current collector, (b) of FIG. 3 is a plan view of (a) of FIG. 3, and (c) of FIG. 3 is a partial cross-sectional view of (a) of FIG. 3. (a) of FIG. 4 is a schematic perspective view of a second current collector, (b) of FIG. 4 is a plan view of (a) of FIG. 4, and (c) of FIG. 4 is a partial cross-sectional view of (a) of FIG. 4. (a) to (c) of FIG. 5 are diagrams for explaining a method of manufacturing a thermoelectric module.

As shown in (a) to (c) of FIG. 3, first, a first current collector 3 having a band shape in a plan view and extending in the horizontal direction is prepared. In the first current collector 3, the electrolyte layer 13 is provided on each of the surface 3b and the surface 3c. Each electrolyte layer 13 is formed to extend along the longitudinal direction of the first current collector 3. In the longitudinal direction, the edge of the first current collector 3 and the edge of each electrolyte layer 13 are aligned with each other. On the other hand, in the lateral direction of the first current collector 3, the edge of the first current collector 3 and the edge of each electrolyte layer 13 are not aligned with each other. Specifically, the protruding portion 3a of the first current collector 3 protrudes from the electrolyte layer 13 in the lateral direction. Each electrolyte layer 13 is formed by, for example, a squeegee method, a screen printing method, a sputtering method, a vacuum deposition method, a CVD method, a sol-gel method, or a spin coating method.

As shown in (a) to (c) of FIG. 4, a second current collector 4 having a band shape in a plan view is prepared. In the second current collector 4, a thermoelectric conversion layer 12 is provided on each of the surface 4b and the surface 4c. The electron transport layer 12b included in the thermoelectric conversion layer 12 is in contact with the second current collector 4. Each thermoelectric conversion layer 12 is formed to extend along the longitudinal direction of the second current collector 4. In the longitudinal direction, the edge of the second current collector 4 and the edge of each thermoelectric conversion layer 12 are aligned with each other. On the other hand, in the lateral direction of the second current collector 4, the edge of the second current collector 4 and the edge of each thermoelectric conversion layer 12 are not aligned with each other. Specifically, the protruding portion 4a of the second current collector 4 protrudes from the thermoelectric conversion layer 12 in the lateral direction. The preparation of the first current collector 3 provided with the electrolyte layer 13 and the preparation of the second current collector 4 provided with the thermoelectric conversion layer 12 may be performed simultaneously or at different timings.

Next, as shown in (a) of FIG. 5, the stack 31 is formed by stacking the first current collector 3 provided with the electrolyte layer 13 and the second current collector 4 provided with the thermoelectric conversion layer 12. At this time, the first current collector 3 and the second current collector 4 are stacked such that the directions in which the protruding portions 3a and 4a extend are opposite to each other in the lateral direction of each current collector. The first current collector 3 and the second current collector 4 are stacked such that the longitudinal direction of the first current collector 3 is aligned with the longitudinal direction of the second current collector 4. When the first current collector 3 and the second current collector 4 are stacked, one of the pair of electrolyte layers 13 provided in the first current collector 3 is in contact with one of the pair of thermoelectric conversion layers 12 provided in the second current collector 4. Thus, a thermoelectric element 2 having the one of the pair of electrolyte layers 13 and the one of the pair of thermoelectric conversion layers 12 is formed between the first current collector 3 and the second current collector 4.

Next, as shown in (b) of FIG. 5, the stack 31 is wound along the longitudinal direction. At this time, the thermoelectric conversion layer 12 and the electrolyte layer 13 are wound following the first current collector 3 and the second current collector 4, respectively. Accordingly, as shown in (c) of FIG. 5, the other of the pair of electrolyte layers 13 provided in the first current collector 3 and the other of the pair of thermoelectric conversion layers 12 provided in the second current collector 4 are in contact with each other. Accordingly, a thermoelectric element 2 having the other of the pair of electrolyte layers 13 and the other of the pair of thermoelectric conversion layers 12 is formed. By subsequently winding the stack 31, the first thermoelectric module 11 and the second thermoelectric element 21 are alternately provided in the stacked direction of the first current collector 3 and the second current collector 4. After the stack 31 is wound, the protruding portion 3a of the first current collector 3 is connected to the outer electrode 5, and the protruding portion 4a of the second current collector 4 is connected to the outer electrode 6, thereby manufacturing the thermoelectric module 1 having the cross section shown in FIG. 1.

The thermoelectric module 1 according to the first embodiment described above includes the first thermoelectric module 11 and the second thermoelectric element 21 stacked each other in the stacked direction. As a result, the thermoelectric elements 2 can be efficiently arranged in a limited space according to the application. Moreover, in the thermoelectric module 1, the first thermoelectric module 11 and the second thermoelectric element 21 are connected in parallel to each other. Therefore, the output current of the thermoelectric module 1 can be increased by outputting currents from both the first thermoelectric module 11 and the second thermoelectric element 21. For example, in an application in which the installation space of the thermoelectric module is greatly limited and downsizing thereof is desired, both downsizing of the thermoelectric module 1 and an increase in the output current can be easily achieved.

In the first embodiment, the thermoelectric module 1 further includes a second current collector 4 including a surface 4b in contact with the thermoelectric conversion layer 12 included later in the first thermoelectric module 11 and a surface 4c in contact with the thermoelectric conversion layer 12 included later in the second thermoelectric element 21, and the first current collector 4, the first thermoelectric module 11, the second thermoelectric element 21 and the second current collector 3 extend along a direction intersecting the stacked direction and are wound. In this case, the thermoelectric elements 2 can be arranged more efficiently. For example, in an application in which the installation space of the thermoelectric module is greatly limited and miniaturization thereof is desired, miniaturization of the thermoelectric module 1 and an increase in the output current of the thermoelectric module 1 can be favorably realized.

In the first embodiment, the thermoelectric conversion layer 12 includes an electron thermal excitation layer 12a and an electron transport layer 12b stacked with each other in the stacked direction, and the electron thermal excitation layer 12a is located between the electron transport layer 12b and the electrolyte layer 13. Therefore, electrons are satisfactorily extracted from the electron thermal excitation layer 12a via the electron transport layer 12b, so that the performance of the thermoelectric module 1 can be improved.

In the following, the first modification of the first embodiment will be described with reference to FIG. 6, and the second modification of the first embodiment will be described with reference to (a) and (b) of FIG. 7.

FIG. 6 is a schematic cross-sectional view showing a part of a thermoelectric module according to a first modification of the first embodiment. As shown in FIG. 6, the stack 31 may be wound while being folded. In this case, the wound body of the first current collector 3, the thermoelectric element 2 and the second current collector 4 is provided with a corner. From the viewpoint of suppressing the damage caused by the corner, it is desirable that each constituent element included in the stack 31 exhibits good flexibility. It is more desirable that at least one of the constituent elements exhibits extensibility. Also in such a first modification, the same operation and effect as those of the first embodiment are achieved.

(a) of FIG. 7 is a perspective view showing the stack in a pre-winding state. In the second modification, as shown in FIG. (a) of 7, the electrolyte layers 13 are intermittently provided on the surfaces 3b and 3c of the first current collector 3 along the longitudinal direction of the first current collector 3. Therefore, in the first current collector 3, an exposed portion 3d exposed from the electrolyte layer 13 is provided on a region between the electrolyte layers 13 adjacent to each other in the longitudinal direction. Similarly, thermoelectric conversion layers 12 are intermittently provided on the surfaces 4b and 4c of the second current collector 4 along the longitudinal direction of the second current collector 4. Therefore, in the second current collector 4, an exposed portion 4d exposed from the thermoelectric conversion layer 12 is provided on a region between the thermoelectric conversion layers 12 adjacent to each other in the longitudinal direction. The thermoelectric conversion layer 12 and the electrolyte layer 13 are stacked each other in the stacked direction. Therefore, the exposed portions 3d and 4d overlap each other in the stacked direction.

(b) and (c) of FIG. 7 are views showing a state in which the stack is wound. As shown in (b) and (c) of FIG. 7, the stack 31A is folded by bending the exposed portions 3d and 4d. Since the bent portion becomes larger toward the outer peripheral side of the wound body, the dimension of the exposed portions 3d and 4d along the longitudinal direction may gradually increase from one side to the other side. Alternatively, each of the first current collector 3 and the second current collector 4 may exhibit extensibility. In this case, bending of the thermoelectric element 2 can be favorably prevented.

Also in such a second modification, the same operation and effect as those of the first embodiment are achieved. Moreover, in the stack 31A, bending of the thermoelectric element 2 can be prevented. Therefore, even when the constituent elements included in the thermoelectric element 2 do not exhibit flexibility, the stack 31A can be wound.

Second Embodiment

Hereinafter, a thermoelectric module according to an second embodiment will be described. In the description of the second embodiment, description overlapping with the first embodiment will be omitted, and portions different from the first embodiment will be described. That is, the description of the first embodiment may be appropriately applied to the second embodiment within a technically possible range.

FIG. 8 is a schematic cross-sectional view illustrating a thermoelectric module according to an second embodiment. As shown in FIG. 8, the thermoelectric module 1A includes a first current collector 3A provided with an electrolyte layer 13A, a second current collector 4A provided with a thermoelectric conversion layer 12a, an outer electrode 5 connected to the first current collector 3A, and an outer electrode 6 connected to the second current collector 4A. An edge 3e located opposite to the protrusion 3a in the first current collector 3A is covered with the electrolyte layer 13A. Therefore, in the second embodiment, unlike the first embodiment, the electrolyte layer provided on the surface 3b of the first current collector 3A and the electrolyte layer provided on the surface 3c of the first current collector 3A are integrated with each other on the edge 3e. Similarly, an edge 4e located opposite to the protruding portion 4a in the second current collector 4A is covered with the thermoelectric conversion layer 12a. Therefore, in the second embodiment, it can be said that the thermoelectric conversion layer provided on the surface 4b of the second current collector 4A and the thermoelectric conversion layer provided on the surface 4c of the second current collector 4A are integrated with each other on the edge 4e.

Also in the second embodiment described above, the same operational effects as those of the first embodiment described above are exhibited. In addition, according to the second embodiment, the electrolyte layer provided on the surface 3b and the electrolyte layer provided on the surface 3c can be simultaneously formed on the first current collector 3A. The thermoelectric conversion layer provided on the surface 4b and the thermoelectric conversion layer provided on the surface 4c can be simultaneously formed on the second current collector 4A. Thus, the manufacturing cost of the thermoelectric module 1A can be reduced.

The thermoelectric module according to the present disclosure is not limited to the above-described embodiment and the above-described modifications, and various other modifications are possible. For example, in the above-described embodiment and the above-described modification, the thermoelectric element includes the thermoelectric conversion layer and the electrolyte layer, but not limited thereto. The thermoelectric element may have layers other than the a couple of layers described above. The thermoelectric conversion layer includes an electron thermal excitation layer and an electron transport layer, but is not limited thereto. The thermoelectric conversion layer may have a layer other than the above couple of layers, or may have only an electron thermal excitation layer.

In the above embodiment and the above modification, the stack between the first current collector provided with the electrolyte layer and the second current collector provided with the thermoelectric conversion layer is wound, however, no limited thereto. For example, the thermoelectric module may include a plurality of the first current collectors and a plurality of the second current collectors, and the first current collectors and the second current collectors may be alternately stacked. In this case, the output current of the thermoelectric module can be increased while limiting the area of the thermoelectric module in a plan view. In addition, since the thermoelectric element and each current collector do not have to exhibit flexibility, the degree of freedom in designing the thermoelectric module can be improved. When the first current collectors and the second current collectors are simply and alternately stacked, the end of the thermoelectric module in the stacked direction may be formed by a current collector.

In the embodiment and the modification, the thermoelectric module may be covered with a protective material or the like. In this case, the thermoelectric module can be prevented from being damaged. The protective material may cover the entire thermoelectric module or a part thereof. For example, the protective material may cover only the side surfaces of the thermoelectric module. As a specific example, the protective material may cover only a portion exposed from the current collector and the outer electrode in the thermoelectric element. From the viewpoint of thermoelectric generation efficiency, the protective material preferably exhibits high thermal conductivity. The protective material is, for example, a resin including Si (Si heat transfer resin), ceramics, highly heat conductive glass, or the like. The protective material may include a thermally conductive member exhibiting high thermal conductivity. The thermally conductive member may exhibit electrical conductivity. In this case, the heat conducting member is completely covered by the insulator.

REFERENCE SIGNS LIST 1, 1A: thermoelectric module
2: thermoelectric element 3, 3A: first current collector
3a: protrusion
3b: surface
3c: surface
3d: exposed portion
3e: edge
4, 4A: second current collector
4a: protrusion
4b: surface
4c: surface
4d: exposed portion
4e: edge
5, 6: outer electrode
11: first thermoelectric element
12: thermoelectric conversion layer
12a: electron thermal excitation layer
12b: electrolyte layer
13: second thermoelectric element
31, 31A: stack.

The invention claimed is:

1. A thermoelectric module comprising:
a first thermoelectric element including a first thermoelectric conversion layer and a first electrolyte layer sequentially stacked along a stacked direction;
a second thermoelectric element stacking the first thermoelectric element in the stacked direction, the second thermoelectric element including a second electrolyte layer and a second thermoelectric conversion layer sequentially stacked along the stacked direction;
a first current collector located between the first thermoelectric element and the second thermoelectric element in the stacked direction;
a second current collector in contact with the first thermoelectric element;
a first outer electrode connected to the first current collector; and
a second outer electrode connected to the second current collector,
wherein the first electrolyte layer and the second electrolyte layer face each other with the first current collector therebetween, and
wherein the first thermoelectric element and the second thermoelectric element are connected in parallel to each other, and
wherein the first thermoelectric conversion layer and the second thermoelectric conversion layer are not integrated with each other, and the first electrolyte layer and the second electrolyte layer are integrated with each other on a first edge of the first current collector.

2. The thermoelectric module according to claim 1, wherein the second current collector incudes a third surface in contact with the first thermoelectric conversion layer and a fourth surface in contact with the second thermoelectric conversion layer, and
wherein the first current collector, the first thermoelectric element, the second thermoelectric element, and the second current collector extend along a longitudinal direction of the first current collector and are wound.

3. The thermoelectric module according to claim 2, wherein each of the first thermoelectric conversion layer and the second thermoelectric conversion layer is intermittently provided along the longitudinal direction.

4. The thermoelectric module according to claim 1, wherein the first thermoelectric conversion layer includes an electron thermal excitation layer and an electron transport layer stacked each other in the stacked direction, and
wherein the electron thermal excitation layer is located between the electron transport layer and the first electrolyte layer.

5. The thermoelectric module according to claim 2, wherein a wound body of the first current collector, the first thermoelectric element, the second thermoelectric element, and the second current collector is provided with a corner.

6. The thermoelectric module according to claim 2, wherein the first current collector has extensibility.

7. The thermoelectric module according to claim 1, wherein the first electrolyte layer and the second electrolyte layer are not integrated with each other, and the first thermoelectric conversion layer and the second thermoelectric conversion layer are integrated with each other on a second edge of the second current collector, the second edge facing the first outer electrode along the latitudinal direction.

8. A thermoelectric module comprising:
a first current collector;
a thermoelectric conversion layer located on the first current collector;
a second current collector; and
an electrolyte layer located on the second current collector and in contact with the thermoelectric conversion layer,
wherein an edge of the first current collector in a latitudinal direction of the first current collector is covered with the thermoelectric conversion layer and is not covered with the electrolyte layer, and
wherein an edge of the second current collector in the latitudinal direction is covered with the electrolyte layer and is not covered with the thermoelectric conversion layer.

9. The thermoelectric module according to claim 8, wherein the thermoelectric conversion layer is located on a first surface and a second surface of the first current collector, and
wherein the electrolyte layer is located on a third surface and a fourth surface of the second current collector.

10. The thermoelectric module according to claim 8, further comprising a first outer electrode connected to the first current collector, and a second outer electrode connected to the second current collector,
wherein the thermoelectric conversion layer is not located between the edge of the second current collector and the first outer electrode in the latitudinal direction, and
wherein the electrolyte layer is not located between the edge of the first current collector and the second outer electrode in the latitudinal direction.

11. The thermoelectric module according to claim 8, wherein the first current collector has extensibility.

* * * * *